(12) United States Patent
Genei et al.

(10) Patent No.: US 6,370,177 B1
(45) Date of Patent: Apr. 9, 2002

(54) SEMICONDUCTOR LASER AND METHOD OF MANUFACTURING THE SAME

(75) Inventors: Koichi Genei; Makoto Okada, both of Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/281,613

(22) Filed: Mar. 30, 1999

(30) Foreign Application Priority Data

Mar. 30, 1998 (JP) .......................................... 10-083100

(51) Int. Cl.[7] ................................................ H01S 5/00
(52) U.S. Cl. ....................................................... 372/49
(58) Field of Search ............................ 372/49, 99, 102; 359/584; 438/32; 257/79

(56) References Cited

U.S. PATENT DOCUMENTS

| 4,951,291 A | | 8/1990 | Miyauchi et al. | |
|---|---|---|---|---|
| 5,497,389 A | * | 3/1996 | Kasukawa et al. | ............ 372/49 |
| 5,812,580 A | * | 9/1998 | Nabiev et al. | ................ 372/49 |

FOREIGN PATENT DOCUMENTS

| JP | 60-032385 | 2/1985 |
|---|---|---|
| JP | 2-137287 | 5/1990 |
| JP | 7-7225 | 1/1995 |
| JP | 7-45910 | 2/1995 |
| JP | 9-148676 | 6/1997 |
| JP | 9-162496 | 6/1997 |
| JP | 9-326527 | 12/1997 |
| JP | 9-326531 | 12/1997 |
| JP | 10-56234 | 2/1998 |

OTHER PUBLICATIONS

Extended Abstracts (The 43rd Spring Meeting, 1996); The Japan Society Applied Physics and Related Societies, 26a–C–7; K. Tanaka, et al./Mar. 26, 1996.

Extended Abstracts (The 44th Spring Meeting, 1997); The Japan Society of Applied Physics and Related Societies, 31a–NG–7; K. Tanaka, et al./Mar. 28, 1997.

Technical Digest—Third Optoelectronics and Communication Conference, Koichi Gen–ei, et al.; Jul. 12, 1998.

* cited by examiner

*Primary Examiner*—James W. Davie
*Assistant Examiner*—Jeffrey N Zahn
(74) *Attorney, Agent, or Firm*—Hogan & Hartson, L.L.P.

(57) ABSTRACT

A semiconductor laser of present invention is constructed by an aluminum oxide ($Al_2O_3$) film on an end surface opposed to a beam emission surface of the semiconductor laser, a silicon nitride ($SiN_x$, or $Si_3N_4$) film on the aluminum oxide film, and a silicon oxide ($SiO_2$) film on the silicon nitride film. These films are made successively by a method of Electron Cyclotron Resonance (ECR) sputtering.

18 Claims, 6 Drawing Sheets

SEMICONDUCTOR LASER AND METHOD OF MANUFACTURING THE SAME

FIELD OF THE INVENTION

The present invention relates to a semiconductor laser, more particularly to a semiconductor laser having a high-reflectivity-coating formed on its rear facet and a manufacturing method of the same.

BACKGROUND OF THE INVENTION

For the purpose of increasing output powers from semiconductor lasers and/or improving temperature characteristics thereof, high-reflectivity-coatings with multilayers on the rear facets of semiconductor lasers are broadly used.

Figure 1:
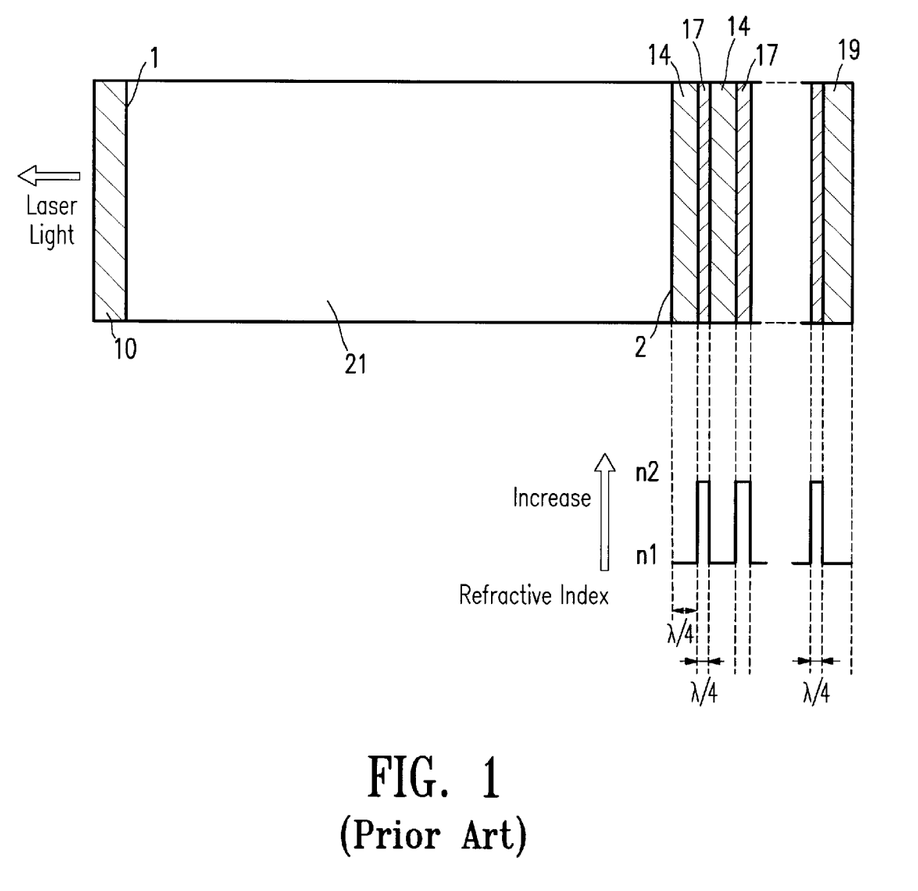
FIG. 1 shows a sectional view in parallel with a stripe structure of a conventional semiconductor laser in which a high reflectivity is formed on its end surface.

A conventional semiconductor laser having a rear facet on which a multi-layer high-reflectivity-coating is made is shown in FIG. 1. In this semiconductor laser, a first low refractivity film 10 is formed on a front facet 1 or a facet from which a laser beam is emitted, of the semiconductor laser 21. The film thickness of the first low refractivity film 10 is controlled so that it exhibits a reflectivity of about 30% or less. On the rear facet 2 opposite to the facet 1, a second low refractivity film 14 and a high refractivity film 17 are alternately formed, resulting in formation of the high reflectivity coating. The thicknesses and the number of the films 14 and 17 are designed so that the whole structure constituted by the films 14 and 17 alternately stacked exhibits a desired reflectivity ranging from 30 to 100%. The thicknesses of the second low refractivity film 14 and the high refractivity film 17 are often set so that their optical thicknesses are $\lambda/4$ relative to a wavelength $\lambda$ of the semiconductor laser. With respect to a third low refractivity film 19 formed on the rear facet 2 side, as the uppermost layer, in order to obtain a desired reflectivity, an optical thickness of the film 19 is set to $\lambda/4$, $\lambda/2$ or an intermediate value between these values. The optical thickness is a product of its exact film thickness (physical film thickness) and refractivity when the incident angle of laser beam on the film is 0 degree.

In a red semiconductor with an oscillation wavelength ranging from 600 to 700 nm and a infrared semiconductor laser with an oscillation wavelength ranging from 700 to 800 nm, aluminium oxide $Al_3O_2$ exhibiting a refractivity ranging 1.6 to 1.7, silicon dioxide $SiO_2$ exhibiting a refractivity ranging from 1.4 to 1.5, and the like have been used as the materials of the first to third low refractivity film. As the material of the high refractivity film, silicon nitride $SiN_x$ exhibiting a refractivity ranging from 1.8 to 2.2, amorphous silicon or $\alpha$-Si exhibiting a refractivity ranging from 3 to 5, titanium oxide $TiO_x$ exhibiting a refractivity ranging from 1.9 to 2.5, zirconium oxide $ZrO_x$ exhibiting a refractivity ranging from 1.8 to 2.2, and the like have been used.

As a difference between the refractivities of the low refractivity films and that of the high refractivity films is larger, a reflectivity per a pair of the low and high refractivity films is larger. Accordingly, it is desirable that a refractivity of the low refractivity film is as low as possible and a refractivity of the high refractivity film is as high as possible.

With respect to the low refractivity film, because a refractivity of $SiO_2$ is lower than that of $Al_2O_3$, $SiO_2$ is more desirable film material than $Al_2O_3$ in respect of the refractivity. However, while a linear expansion coefficient of silicon dioxide is about $1\times10^{-6}$ (1/K) or less, single crystal substrates of compound semiconductors such as AlGaAs group, InP group, InGaP/InGaAlP group and GaN group, which are often used for the semiconductor laser material, that is, such as gallium arsenide (GaAs) substrate, phosphorus (InP) substrate, and sapphire ($Al_2O_3$) substrate exhibit a linear expansion coefficient ranging from 4 to $7\times10^{-6}$ (1/K). The linear expansion coefficient of $SiO_2$ and that of these substrates are greatly differ. $SiO_2$ films was deposited at high temperatures exceeding 100 degrees centigrade and the laser chips with high-reflectivity-coatings were die-bonded on heatsink at a high temperatures exceeding 200 degree centigrade. The great difference between $SiO_2$ films and a rear facet of the semiconductor laser enhances a large stress and causes problems the laser characteristics or laser reliability. For example, a $SiO_2$ film is partially peeled off from the rear facet by the stress thereof. Accordingly, characteristics or reliability of the laser are degraded. For this reason, $SiO_2$ has been seldom selected as the low refractivity film, and $Al_2O_3$ exhibiting a linear expansion coefficient $7\times10^{-6}$ (1/K) which is closer to that of the compound semiconductors has been often used.

However, since $Al_2O_3$ hardly creates a refractivity difference from the high refractivity film 17, any of countermeasures of increasing the number of the pair of low and high refractivity films and using of higher refractivity material for the high refractivity film must be selected. There are following problems in both countermeasures.

In the case of increasing the number of the layers, the stress between the low/high refractivity film and the compound semiconductor layers grown on the semiconductor substrate, as well as between the low/high refractivity film and the semiconductor substrate, as well as between two of the low/high refractivity films, increases, resulting in the film peeled off, not being able to used as a passivation film, promoting a device degradation because the stress is applied to the rear facet. Thus, it is happened a problem of reliability of the semiconductor laser. It is considered that the number of the layers that creates no problem of the reliability of the compound semiconductor is 10 or less. However, when $Al_2O_3$ is selected as the low refractivity film and $SiN_x$ is selected as the high refractivity film, the films of about 15 layers must be coated to obtain the refractivity of 90% or more, so that a problem of reliability is posed. Moreover, even if films posing no problem of the reliability are selected, a time required for depositing the films is too long, so that a problem of productivity is posed.

Next, as the high refractivity film, a selection of a film exhibiting a higher refractivity, for example, of $\alpha$-silicon film, is conceived. After $Al_2O_3$ having a optical thickness $\lambda/4$ is employed as the low refractivity film, $\alpha$-silicon having a optical thickness-$\lambda/4$ is employed as the high refractivity film, a theoretical calculation is performed regardless an optical absorption, so that the reflectivity of about 90% can be realized by the number of the layer equal to 9 or less. In fact, similar layer structures have been broadly used in upper-output-power lasers.

However, since $\alpha$-silicon exhibits a high optical absorption of the order of $1\times10^4 cm^{-1}$ in a 600 nm band of the laser wavelength, the following problems are posed. First, it is difficult to obtain a higher reflectivity because of the optical absorption. When a theoretical estimation is conducted for the case where a design is done so as to obtain a reflectivity of around 90% in a 600 nm band of the wavelength, the reflectivity is lowered by about 10%, compared to the case where the optical absorption is assumed to be zero in the $\alpha$-silicon film. Although the reflectivity increases for increasing the number of the layers in the pair of the low and high refractivity films, it is difficult for the reflectivity to exceed 90%. Also, since a part of an output power from the laser is absorbed by optical absorption in the $\alpha$-Si film, the output power is reduced. Accordingly, when it is tried to obtain a desirable light intensity, a threshold current ($I_{ch}$) of the semiconductor laser and an operation current ($I_{cp}$) thereof increase. Therefore, it is always happened that an efficiency improvement of the laser cannot be taken in spite of formation of multi-layered high reflectivity coating for increasing the output power of laser and improving laser characteristics at high temperatures.

It is pointed out that it is capable of being lowered a COD (Catastrophic Optical Damage) level by a light absorption in α-Si film. (Kiyotake Tanake et. al., Paper being prepared for publication in 43-th associated meeting relating to Japanese Applied Physics Society, 26a-C-7, 1996). The COD is an irreversible degradation around a laser facet of semiconductor lasers, and has limited by the optical output power from semiconductor laser. An optical absorption occurs near the facet because the energy band gap of the active layer near the surface is slightly small compared to the band gap inside of the laser. A heating-up is enhanced according to optical absorption, and the photochemistry reaction and the surface recombination at the facet are accelerated by the heating-up, and further heating-up is generated. There is a positive feedback loop that the energy band gap near the facet becomes still smaller by the heating-up and optical absorption becomes still larger. As a result, the facet is irreversibly damaged at an output power accelerated by the positive feedback. After the enhancement of the COD in the semiconductor laser, $I_{th}$ increases remarkably compared with that before COD, or a laser stops oscillating. After generation of the COD, a non beam-emitted portion called a dark spot or a dark line were observed in a near field-electroluminescence pattern from the degraded facet by applying a very low forward current to the laser and observing the light emitting area by using a microscope.

By this method, it can be confirmed that a degraded portion does not exist inside of the device, but near the facet.

It was thought that the COD is occurred around the front facet with a lower reflectivity coating thereon having a reflectivity, for example, 30% or less, because it is considered that the optical power density around the front facet is greater than that around the rear facet. However, the inventors have found out that a COD occurs around the rear facet with a high reflectivity coating including α-Si films by optical absorption in α-Si films. After an excessive currents are applied to five semiconductor lasers including the front facets with low reflectivity coatings having a reflectivity less than 30%, and the rear facets with the high reflectivity coatings including α-Si films, and let degraded. The electro-luminescence patterns from the front facets were normal, but dark spots or dark lines were observed in those from the rear facets.

Furthermore, there were not any abnormal portions on the coatings observing a secondary electron microscope or an SEM images. Tanaka et al. told that they observed a destruction in a high reflectivity coatings and the COD were to be enhanced by the destruction in the above mentioned reference. However, such a phenomenon was not found as long as Inventors confirm.

As a cause which such the phenomenon generates, Inventors assume the following mechanisms. First, heating-up was enhanced by optical absorptions in α-Si films in high reflectivity coatings. The energy band gaps of the active layers near the rear facets were shrinked by the heating-up. The band gap shrinkage causes not only the increases of the optical absorption, but also further heating-up. The optical absorption and the generation of heat organize a positive feedback loop, and the positive feedback loop enhances the COD's at some output powers.

As described above, in the lasers with high reflectivity coatings including high refractive films with large optical absorption coefficients, the COD occurs around the rear facet but not occurs around the front facet. This causes the difficulties of increasing the output power from the lasers having the high reflectivity coatings on the rear facets including high refractive films with large optical absorption coefficients.

Moreover, by increasing the number of layer constructing a laser, a light intensity from the rear facet covered by the high reflective coating is decreasing. For regulating the output power of laser, it is common that an automatic power control or an APC feeding back the amount of laser to an output power from the rear facet by detecting photo-current in a rear photodiode. Since the output power from the front facet of the laser is proportional to the photo-current, the output power from the front facet can be controlled by a negative feedback of the photocurrent by a circuitry. However, using the α-Si as the high refractivity film in multi-layered structure including over five layers, it is not capable of receiving an amount of light enough to control the power from the rear facet.

When $TiO_x$ or $ZrO_x$ with a very low absorption coefficient is selected as the high refractivity film, a problem relating to the foregoing points is not so much. Since these materials prepared by some deposition schemes have the optical absorption coefficients of zero or a little, there were less problem than the case using α-silicon. The refractivity of these films may exceed 2.0, and a desired reflectivity can sometimes realize with the number of layers equal to 10 or less.

However, these films involve problems in their deposition methods. Deposition by electron beam heating is generally used for formation the $TiO_x$ or $ZrO_x$ film. In the film formation by the electron beam deposition, the deposited substance having high energy directly collides with the facet of the semiconductor laser, so that damages to the facet is happened. Actually, with respect to a red semiconductor laser, the laser using a film formed by the electron beam heating deposition tends to be degraded rapidly.

For this reason, a method to form a $TiO_x$ film by an ECR (Electron Cyclotron Resonance) sputtering which applies little damage to the facet is proposed, in Japanese Patent Laid-Open No. 9-162496 and in the paper being prepared for publication in 44th associated meeting relating to Japanese Applied Physics Society, 31-NG-7, 1997, by Kiyotake Tanaka et. al.

However, a target for manufacturing these films is too expensive. Moreover, Ti, that is the target material for formation of the $TiO_x$ film, strongly acts as an oxide getter, so that it is considered that use of Ti in the ECR sputtering in which the target reacts with gas entails difficulty. Accordingly, this method is not practical.

As described above, it is impossible to provide the conventional semiconductor laser in which the high reflectivity coating composed of multi-layers is coated on its facet, which is capable of preventing the occurrence of the problem peeling off the high reflectivity coating from its facet and the problem of the reduction in the reflectivity due to the optical absorption, in addition to the problem in the manufacturing processes.

SUMMARY OF THE INVENTION

The present invention was made to eliminated the above-described problems, and the object of the present invention is to provide a semiconductor laser with a multilayer high reflectivity coating, which is capable of exhibiting a high performance and high productivity such as a high reliability, a low threshold and a low operation current.

To achieve the above object, the present invention provide a semiconductor laser comprising a laser device having a first front facet emitting laser beam therefrom, and a second end surface, wherein the first rear facet is opposed to the second end surface, and a multi-layered high reflection film formed on the second facet, and including, a first low refractivity film formed on the second rear facet of the semiconductor laser, made by an apparatus for forming a thin film without damaging the film, and having a coefficient of linear expansion is 30% more/less than that of a substrate of the semiconductor laser, a refractivity n1 less than 1.8, and an optical thickness thereof about $\lambda/4$ while $\lambda$ is defined as a wavelength of the semiconductor laser, a first high refractivity film formed on the first low refractivity film, made by an apparatus for forming a thin film without damaging the film, and having a refractivity n2 more than 1.9, an amount of k of a negative imaginary part of the refractivity or $-ik$ less than 0.05, and an optical thickness thereof about $\lambda/4$, and a second low refractivity film formed on the first high refractivity film, made by an apparatus for forming a thin film without damaging the film, and having a refractivity n3 less than 1.7 and less than n1, wherein the second low refractivity film is made by a material different from a material of the first low refractivity film.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF DRAWINGS

A more complete appreciation of the present invention and many of its attendant advantages will be readily obtained by reference to the following detailed description considered in connection with the accompanying drawings, in which.

DETAILED DESCRIPTION OF PREFERRED EMBODIMENTS

A first embodiment of the present invention will be described with reference to FIGS. 2 and 3 below.

Figure 2:
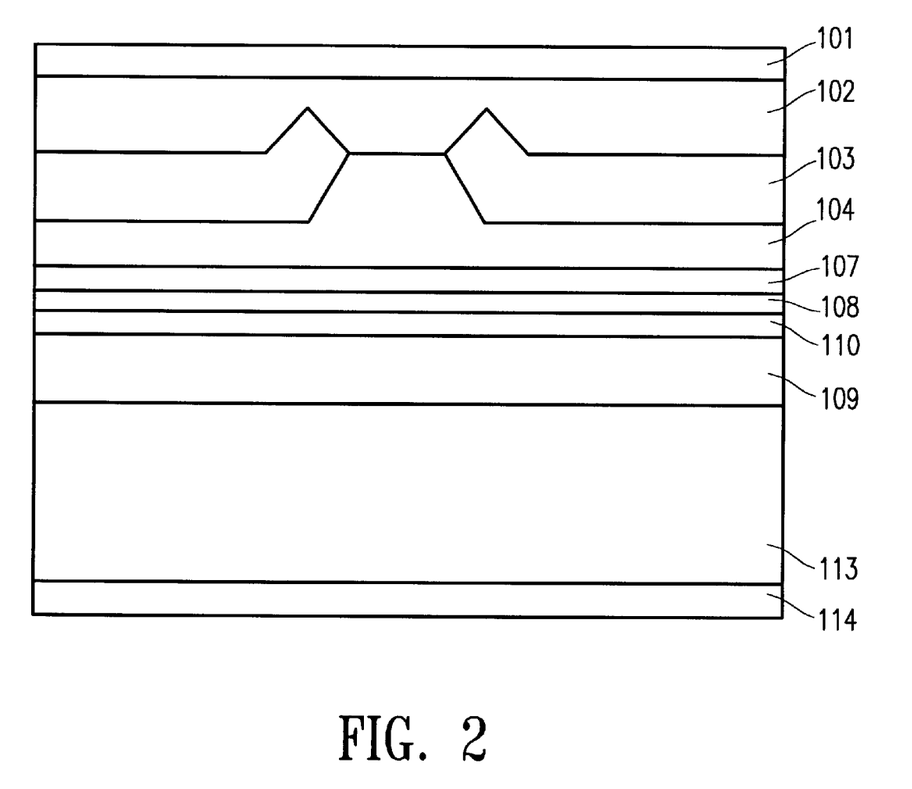
FIG. 2 shows a sectional view perpendicular to a ridge stripe of a red semiconductor laser of a first embodiment of the present invention.

FIG. 2 is a sectional view perpendicular to a ridge stripe of a red semiconductor laser of a first embodiment of the present invention. The semiconductor laser of this embodiment is a red semiconductor laser of a wavelength 600 nm band, and has a structure that a first clad layer 109 made of n-type In $(Ga_{1-x}Al_x)$ P ($0<x\leq 1$) is formed a n-type GaAs substrate 113. On the first clad layer 109, a first guide layer 110 made of $In(Ga_{1-y}Al_y)P$ ($0<y\leq 1$), a multi-quantum well (MQW) activation layer 108 made from InGaP well layer and In $(Ga_{1-z}Al_z)P$ ($0<z\leq 1$) barrier layer, a second guide layer 107 made of $In(Ga_{1-y'}Al_{y'})P$ ($0<y'\leq 1$), and a second clad layer 104 made of p-type $In(Ga_{1-x'}Al_{x'})P$ ($0<x'\leq 1$) are made in this order. It is desirable a composition of aluminium in the first clad layer x and that in the second clad layer x' are about 0.7. A value 0.7 is the largest numerical value in the numerical range in which the electrons and halls in the layer recombines by a direct transition process. Moreover, it is desirable a composition of aluminium in the first and second guide layer y and y' and that in the barrier layer z are in the range from 0.4 to 0.65. The range from 0.4 to 0.65 is appropriate for confining electronic carrier or light emission. On the second clad layer 104, a current blocking layer made of n-type GaAs, a contact layer 102 made of p-type GaAs, and a p-type electrode 101 are formed. An n-type electrode 114 is formed on the lower surface of the n-type GaAs substrate 113.

Figure 3:
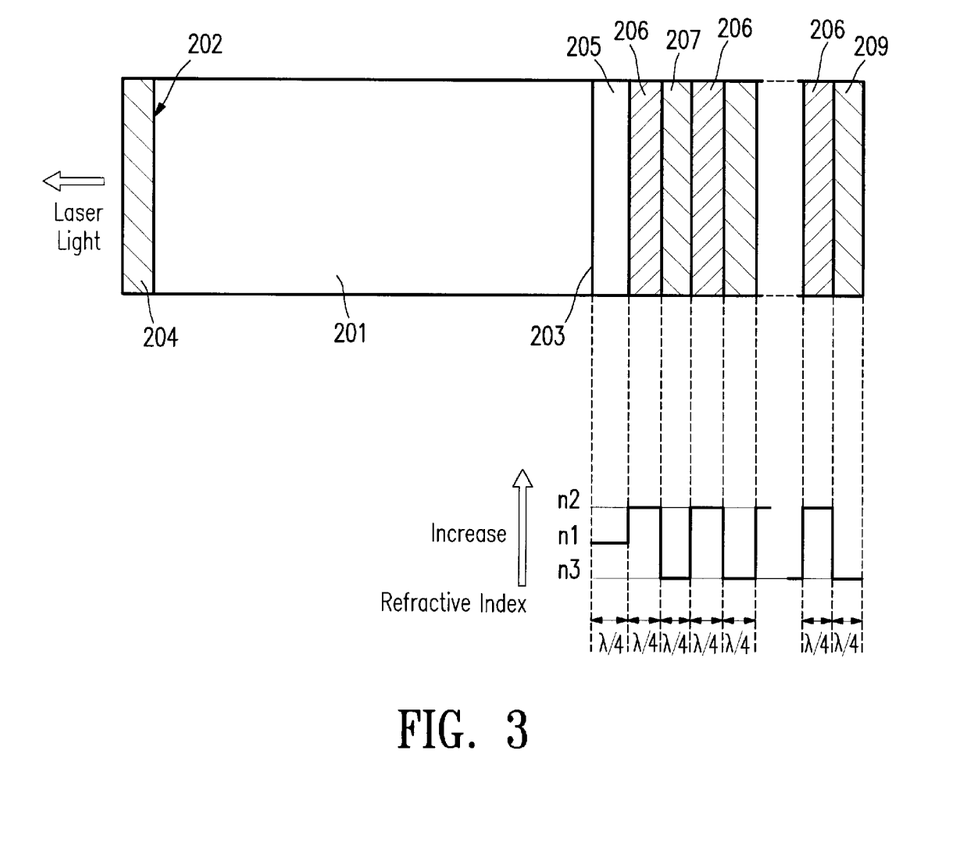
FIG. 3 shows a sectional view in parallel with the ridge stripe of the red semiconductor laser of the first embodiment of the present invention, in which a final layer is formed of a second low refractivity film.

FIG. 3 is a sectional view in parallel with the ridge stripe in the red semiconductor laser shown in FIG. 2. The semiconductor laser 201 has a low refractivity film 204 of a refractivity less than 1.8 on a laser beam output end face 202 (hereinafter, it is written "front facet 202"). As a first layer, a low refractivity film 205 that is an oxide film is formed on the other facet 203. The low refractivity film 205 exhibits a linear expansion coefficient within $\pm 30\%$ compared to that of the GaAs crystal substrate 113 of the semiconductor laser 201, as well as a refractivity $n_1$ less than 1.8. Aluminum oxide $Al_2O_3$ is most suitable for the material of the low refractivity film 205. Though the linear expansion coefficient of the GaAs substrate 113 somewhat differs among the literatures, it is about $6.4\times 10^{-6}$ (1/K). Accordingly, the linear expansion coefficient of the low refractivity film 205 must be between $4.5\times 10^{-6}$ and $8.3\times 10^{-6}$ (1/K). Moreover, the optical film thickness of the low refractivity film 205 is set so that it becomes about $\lambda/4$ against the oscillation wavelength $\lambda$ of the laser. $Al_2O_3$ exhibits a refractivity ranging about 1.6 to 1.7 at a wavelength of 400 nm zone and a wavelength of 600 nm zone, and exhibits a linear expansion coefficient ranging from 7.1 to $7.2\times 10^{-6}$ (1/K). Accordingly, $Al_2O_3$ satisfies all of the foregoing conditions. With reference to the film thickness of the $Al_2O_3$ film, it is satisfactory that when the $Al_2O_3$ film exhibits a refractivity 1.67, its film thickness is controlled about 100 nm for a semiconductor laser emitting a beam of a wavelength ranging from 630 to 690 nm. As is referred to the oxide films such as the $Al_2O_3$ film in Japanese Patent Laid-Open No. 9-1262496, they exhibit a small stress against compound semiconductors, and excellent in a close adhesion to the compound semiconductors, and they have been broadly used for a reflection film and a passivation film for the semiconductor laser and their reliability have also been confirmed. A refractivity of a film having a property of light absorption is indicated by a complex formula as described below.

$$\overline{n} = n - ik$$

n is a real refractivity, $-ik$ is an imaginary part shown a degree of light absorption. As large the value of k is, the value of light absorption becomes larger. As a second layer, a high refractivity film 206 is formed so that it has an optical film thickness of $\lambda/4$ against the oscillation wavelength $\lambda$ of the laser. The high refractivity film 206 exhibits a refractivity $n_2$ exceeding 1.9, and exhibits a k value less than 0.05, which is the one of a negatived imaginary part $-ik$ of the refractivity causing an optical absorption. Here, that the absolute value of the negative imaginary part of the refractivity is small means that it has less effect on the optical absorptance. Silicon nitride $SiN_x$ exhibits a refractivity ranging from 1.95 to 2.1 at wavelengths of 400 nm band and 600 nm band. The negative imaginary part of the refractivity in the foregoing wavelength is about zero and satisfies the foregoing conditions.

As a third layer, a low refractivity film 207 exhibiting a refractivity $n_3$ less than 1.7 is formed. Silicon dioxide $SiO_2$ exhibits a refractivity ranging about 1.45 to 1.5 in a wavelength of 400 nm band and a wavelength of 600 nm band, and satisfies this condition. When a desired refractivity is obtained by setting an optical film thickness of the third layer to a range between $\lambda/4$ and $\lambda/2$ against the oscillation wavelength of the laser, the third layer is used as a uppermost layer. For example, in a semiconductor laser having the structure of FIG. 2, which emits a laser beam of a wavelength of 680 nm, when the refractivity film 205 is formed of $Al_2O_3$, the high refractivity film 206 is formed of $SiN_x$, and the low refractivity film 207 that is the uppermost film is formed of $SiO_2$, and when it is assumed that the refractivity $n_1$ of the film 205 is 1.67, the refractivity $n_2$ of the film 206 is 2.0, and the refractivity $n_3$ of the uppermost film is 1.5, the reflectivity is about 45%, which is computed by respectively setting optical film thicknesses of the films 205, 206 and 207 to $\lambda/4$, $\lambda/4$ and $\lambda/2$ against the laser oscillation wavelength.

When the desired refractivity is not obtained by the third film, the optical film thickness of the low refractivity film 207 is set to $\lambda/4$ against the oscillation wavelength of the laser. When $n_3=1.5$ and the wavelength ranges from 630 to 680 nm, it is desirable that the film thickness (not optical film thickness) is set to about 110 nm. Therefore, the high refractivity film 206 and the low refractivity film 207 are alternately stacked on the rear facet 203 while setting the respective optical film thickness to $\lambda/4$, and the optical film thickness of the low refractivity film 209 that is the uppermost film is set to $\lambda/4$, $\lambda/2$ or any value, thus designing so as to obtain the desired refractivity. For example, a wavelength of 680 nm is used, $Al_2O_3$ is used for first layer, $SiN_x$ is used for a second layer, and $SiO_2$ is used for a third layer. The refractivity $n_1$ of the first layer is set to 1.67, the refractivity $n_2$ of the second layer is set to 2.0, and the refractivity $n_3$ is set to 1.5. Moreover, a $SiN_x$ layer and a $SiO_2$ layer are alternately formed, and an optical film thickness of the uppermost low refractivity film $SiO_2$ is set to $\lambda/2$, resulting in forming a layer structure composed of nine layers in total. At this time, the reflectivity is about 87%. Specifically, it will be possible to obtain the desired reflectivity ranging from about 30 to 90% with the foregoing structure.

In the present invention, depending on a film formation time necessary for manufacturing the uppermost film having a specified film thickness, it is decided whether the total number of layers is odd number or even number. Noted that when the uppermost layer is formed of the low refractivity film, the total number of layers is odd number, and when the uppermost layer is formed of the high refractivity film, the total number of layers is even number.

When the low and high refractivity films having an optical thickness film of $\lambda/4$ are alternately stacked for the purpose of obtaining a high reflectivity coating, a maximum reflectivity to be obtained is determined by a high reflectivity coating in which the high refractivity film is formed at the uppermost position. Even if a low refractivity film having any film thickness is formed on this high refractivity film, the reflectivity never increases. Therefore, from viewpoint of a productivity, if the uppermost layer is a high refractivity film when a high reflectivity coating exhibiting a certain reflectivity is formed, the film formation time can be shortened, so that it is said that the foregoing film structure is desirable.

On the other hand, when the film formation time for achieving a high refractivity film thickness of the uppermost layer is very short, it is difficult to control the film thickness of the uppermost layer by the film formation time. Consequently, a change of the reflection of the high reflection film is increasing, and a decreasing of a reproducibility in processes for a design of the high reflection film is posed from viewpoint of a product management. In this case, it is more desirable for the film structure to use the low refractivity as the uppermost layer, which is considered to exhibit a high precision in the film thickness. Because the film formation time for obtaining a certain optical film thickness becomes longer for a low refractivity.

In consideration for parameters for evaluating a throughput and a productivity by design values of the reflectivity and characteristics of each device, a controllability of processes, and a management precision indicated by a process reproducibility for a design of the high reflection film, it is decided whether the uppermost layer is to be formed by a low refractivity film or a high refractivity film. Noted that in the high reflectivity coating using $Al_2O_3$ and $\alpha$-Si, since $\alpha$-Si is a semiconductor and exhibits a conductivity, the uppermost layer could not be formed by a high refractivity film. This is because when an explanation for it is made using FIG. 3, an electrode of the laser device is formed on upper and lower surfaces in parallel with a laser beam emission direction, and the electrodes formed on the upper and lower surfaces are capable of short-circuited through $\alpha$-Si. Contrary to this, the possibility of forming the uppermost layer by the high refractivity film is the significant feature of the present invention.

Figure 4:
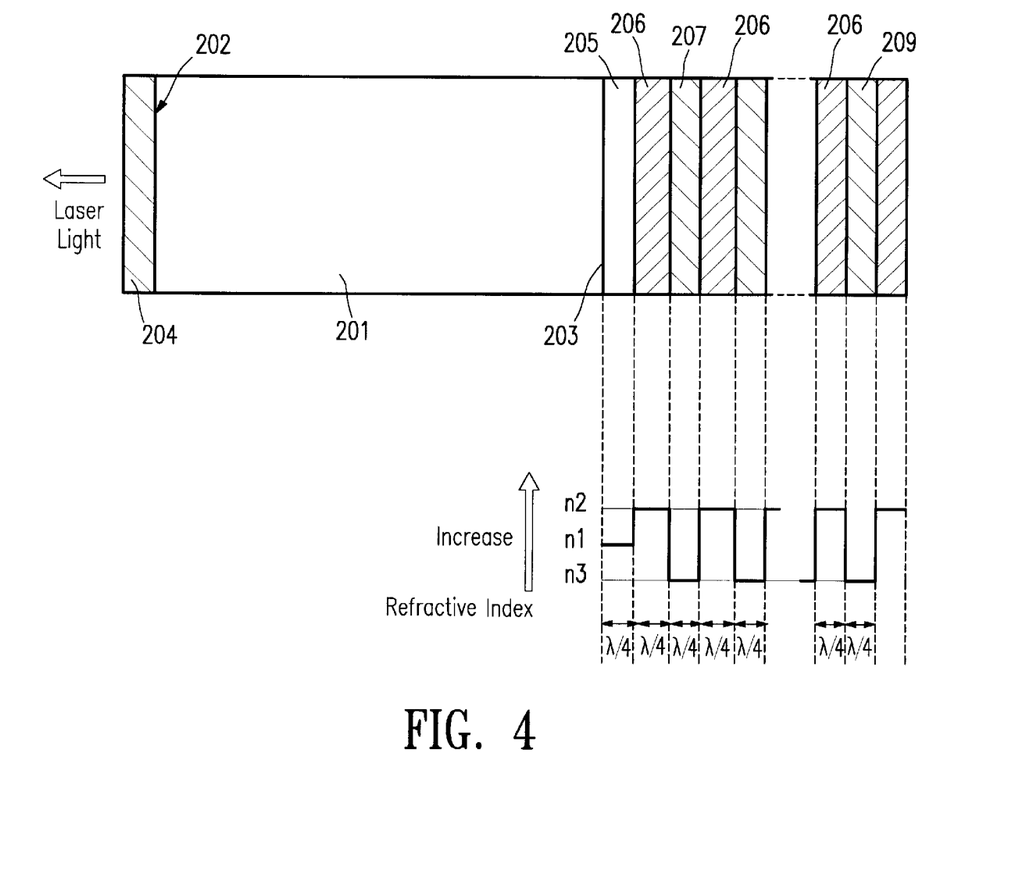
FIG. 4 shows a sectional view in parallel with the ridge stripe of the red semiconductor laser of the first embodiment of the present invention, in which a final layer is formed of a first high refractivity film.

FIG. 4 is a sectional view in parallel with a ridge stripe of a red semiconductor laser relating to an example in which the final layer is formed by a first high refractivity film. As a first layer, a low refractivity film $Al_2O_3$ that is an oxide film is formed on an rear facet opposite to a beam emission front facet of the semiconductor laser so that it has an optical film thickness of $\lambda/4$ against the oscillation wavelength $\lambda$ of the laser.

The low refractivity film $Al_2O_3$ exhibits a linear expansion coefficient within ±30% compared to a GaAs substrate 113 and a refractivity $n1$ less than 1.8. As a second layer, a high refractivity film $SiN_x$ is formed so that it has an optical film thickness of $\lambda/4$ against the oscillation wavelength $\lambda$ of the laser. The high refractivity film exhibits a refractivity $n_2$ exceeding to 1.9, and exhibits a k value less than 0.05, which is a coefficient of a negative imaginary part $-ik$ of the refractivity causing an optical absorption. As a third layer, a low refractivity film $SiO_2$ exhibiting a refractivity $n_3$ less than 1.7 is formed. The structure composed of the first to third layer is the same as that of the foregoing first embodiment. The uppermost layer is constituted by a high refractivity film using $SiN_x$ as a material.

In the semiconductor lasers shown in FIGS. 3 and 4, the high reflectivity coating is formed only on the facet on one side. As a matter of course, the high reflectivity coating according to the present invention may be formed on both facets depending on the purposes, and application of the present invention is possible. Moreover, the coating by the low refractivity film 204 is in some cases manufactured by stacking two kinds of low refractivity films, and the present invention can be applied to such semiconductor laser.

Figure 5:
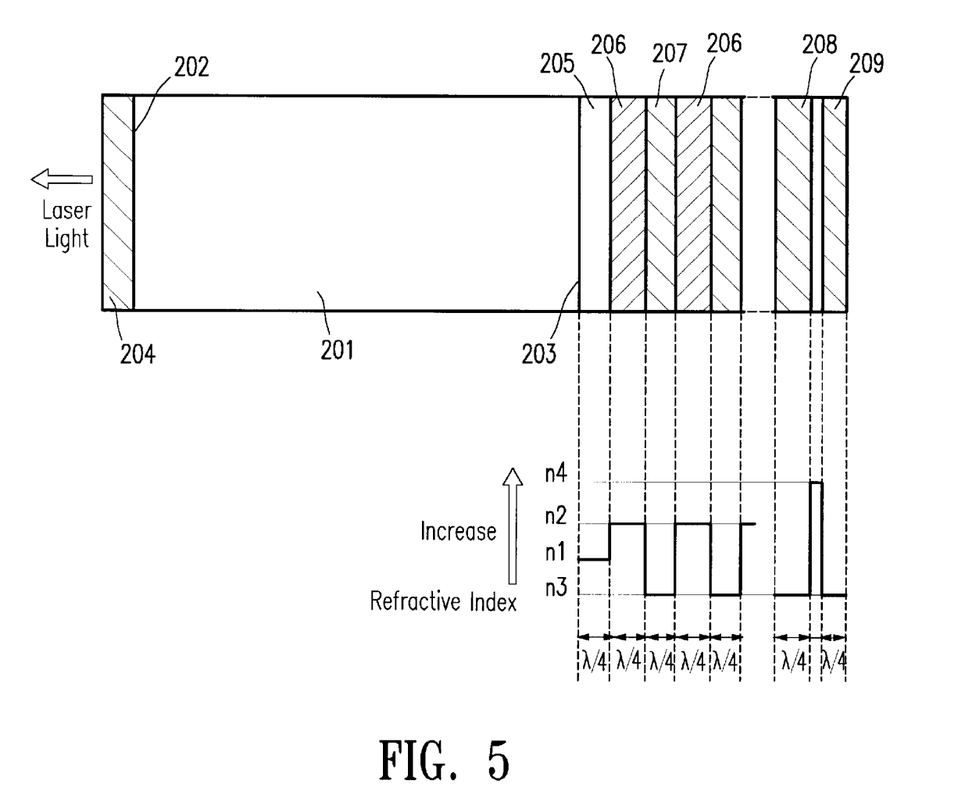
FIG. 5 shows a sectional view in parallel with the ridge stripe of the red semiconductor laser of the first embodiment of the present invention.

Next, a second embodiment of the present invention will be described. FIG. 5 is a sectional view in parallel with a ridge stripe of a red semiconductor laser relating to the second embodiment of the present invention.

As a first layer, a low refractivity layer $Al_2O_3$ that is an oxide film is formed on an rear facet opposite to a beam emission front facet of the semiconductor laser so that is has an optical film thickness of $\lambda/4$ against the oscillation wavelength $\lambda$ of the laser. The low refractivity film $Al_2O_3$ exhibits a linear expansion coefficient within ±30% compared to a GaAs substrate 113 and a refractivity $n_1$ less than 1.8. As a second layer, a high refractivity film $SiN_x$ is formed so that it has an optical film thickness of $\lambda/4$ against the oscillation wavelength $\lambda$ of the laser. The high refractivity film $SiN_x$ exhibits a refractivity $n_2$ exceeding 1.9, and exhibits a k value less than 0.05, which is the coefficient of a negative imaginary part $-ik$ of the refractivity causing an optical absorption. As a third layer, a low refractivity film $SiO_2$ exhibiting a refractivity $n_3$ less than 1.7 is formed. The structure composed of the first to third layer is the same as that of the foregoing first embodiment.

Moreover, the $SiN_x$ layer and the $SiO_2$ layer are alternately formed on the rear facet 203 on the third layer, and the optical film thickness of the low refractivity film that is the uppermost film is set to $\lambda/4$, $\lambda/2$ or any value, thus designing so as to obtain the desired refractivity. These points are the same as those of the foregoing first embodiment.

When stacking of the layers of the number equal to 10 or more is needed in order to obtain a reflectivity higher than that of the first embodiment using the semiconductor laser structure in the first embodiment, the high refractivity film 208 exhibiting a refractivity $n_4$ higher than $n_2$ is formed immediately under the uppermost layer, instead of the high refractivity film $SiN_x$ so that it has an optical film thickness of $\lambda/4$. $\alpha$-Si is suitable for this high refractivity film 208.

If $\alpha$-Si is selected as the high refractivity film 208 located immediately under the uppermost layer, the refractivity of $\alpha$-Si in the wavelength of 600 nm band ranges from 3.5 to 4.5, and the imaginary part of the refractivity is about −0.41 or less. The reflectivity of the coating including the $\alpha$-Si film in consideration for the imaginary part of the refractivity, reflectance of $\alpha$-Si is calculated to be the range of 93 to 96%. This value is almost the upper limit value required for a high reflectance film practically. Thus mentioned above, it is shown that the high reflectivity coating of the present invention is applicable any high reflectivity coating design required practically.

Furthermore, an optical loss in the foregoing setting ranges from 2 to 3%, and it is greatly reduced by one-third or more the optical loss in the conventional film that was 10 to 11%. Thus, a threshold current and an operation current are lowered, and an improvement of temperature characteristics is expected. Also, it enables not only to obtain the sufficient reflectivity of the rear facet coating but a sufficient photo-current in a photodiode for an APC, because the output power from the rear facet becomes larger. Hitherto, though the description was made for the embodiment relating to the red semiconductor laser using InGaP/InGaAlP group which emits a laser beam of a wavelength of 600 nm band, it is apparent that the present invention can be applied to other lasers. The AlGaAs group laser using a GaAs substrate emitting a light of a wavelength of 700 nm band and a light emission of a wavelength of 800 nm band use the same substrates and refractivities of the coating materials are approximately the same to those in 600 nm band. Accordingly, the present invention can be immediately applied without any modification. Moreover, a promising GaN group laser that is a blue ultra laser emitting a beam of a wavelength of 400 nm band uses a sapphire substrate formed of an $Al_2O_3$ crystal, and it is discovered by the Inventors that refractivities of $Al_2O_3$, $SiO_2$ and $SiN_x$ are almost the same the case of a wavelength of 600 nm. Therefore, the present invention can be applied to this. In the GaN group laser, a silicon carbide (SiC) substrate also can be used.

The films formed of such as $Al_2O_3$, $SiO_2$ and $SiN_x$ described in the explanations for the first and second embodiments can be manufactured by switching process gas such as oxygen and nitrogen in an ECR (Electron Cyclotron Resonance) sputtering apparatus. In the ECR sputtering apparatus, a target is provided on a cylindrical inner wall. By application of a magnetic field satisfying ECR conditions, high density plasma generated in the chamber and a microwave introduced into the chamber are combined, and a DC current or a high frequency bias is further applied to the target, allowing ions in the plasma rotating along a circular orbit to collide against the target. Thus, it is possible to effectively combine process gas elements with target elements.

For example, when aluminium is used for the target element, a flow rate X1 of oxygen that is the process gas and the flow rate X2 of argon that is base gas are set to the condition of 0<X1<X2 optimally, whereby the $Al_2O_3$ film can be formed as a sample. In order to obtain a proper refractive index in the $Al_2O_3$ film, the mole fraction of oxygen in the $Al_2O_3$ film should be set a proper value by controlling both X1 and X2. If X1/X2 are too small, a Al rich-$Al_2O_3$ film will be fabricated and both n and k in the refractive index of the film will became greater than proper value. If X1/X2 are too large, a deposition rate of $Al_2O_3$ will drastically decrease and a throughput of coatings will go worse. To avoid these problems, it is desirable the X1/X2 are the range from 0.1 to 0.5. X2 is desirable to be the range from 1 sccm to 100 sccm.

Moreover, Si is used as the target, a flow rate X3 oxygen is used as the process gas, argon is used as the base gas, and the flow rates of the gases are set to the foregoing condition, whereby the $SiO_2$ film can be formed. If nitrogen is supplied as the process gas with flow rate of a X4 to the same target, the $SiN_x$ film can be formed. In case in which argon as the base gas alone is supplied to the Si target, the Si film can be formed.

There are similar relation for mole fractions to flow gas rates on fabrication of the $Si_3N_4$ film and $SiO_2$ film to $Al_2O_3$ film.

X3/X4 are desirable to be the range from 0.1 to 0.5.

Moreover, if the mixture of oxygen and nitrogen is used as the process gas, a nitrogen oxide substance such as AlON and SiON can be also made. Since these process gases are not poisonous and inflammable and easy to handle them, the apparatus can be used safely, and a high productivity can be achieved.

As described above, if the ECR sputtering apparatus having at least the aluminium target and the Si target is employed, the present invention can be realized by switching the process gas without using individually another apparatuses. Accordingly, it is said that the manufacture of the semiconductor laser according to the present invention exhibits a extremely high productivity.

The feature of the ECR sputtering apparatus is that kinetic energy of ions to be sputtered is concentrated in an inner circumference direction along the inner wall of the target, and there is almost no energy in the direction perpendicular to the sample surface on which a film is formed. For this reason, when the film formation is conducted using the ECR sputtering, damages are significantly reduced. From this point, using the ECR sputtering apparatus, the characteristics of the film is remarkable.

Based on the knowledge described above, for the purpose of forming the high reflectivity coating, using the ECR sputtering apparatus, the $Al_2O_3$ film is formed as the first layer, the $SiN_x$ film is formed as the second layer, the $SiO_2$ film is formed as the third layer, the $SiN_x$ film and the $SiO_2$ film are respectively formed as the fourth and fifth layers, the Si film is formed as the sixth layer, and the $SiO_2$ film is formed as the uppermost layer, thus completing the semiconductor laser. Evaluations were conducted for its characteristic, compared to those of the conventional semiconductor laser. The evaluation results are shown in FIG. 6.

Figure 6:
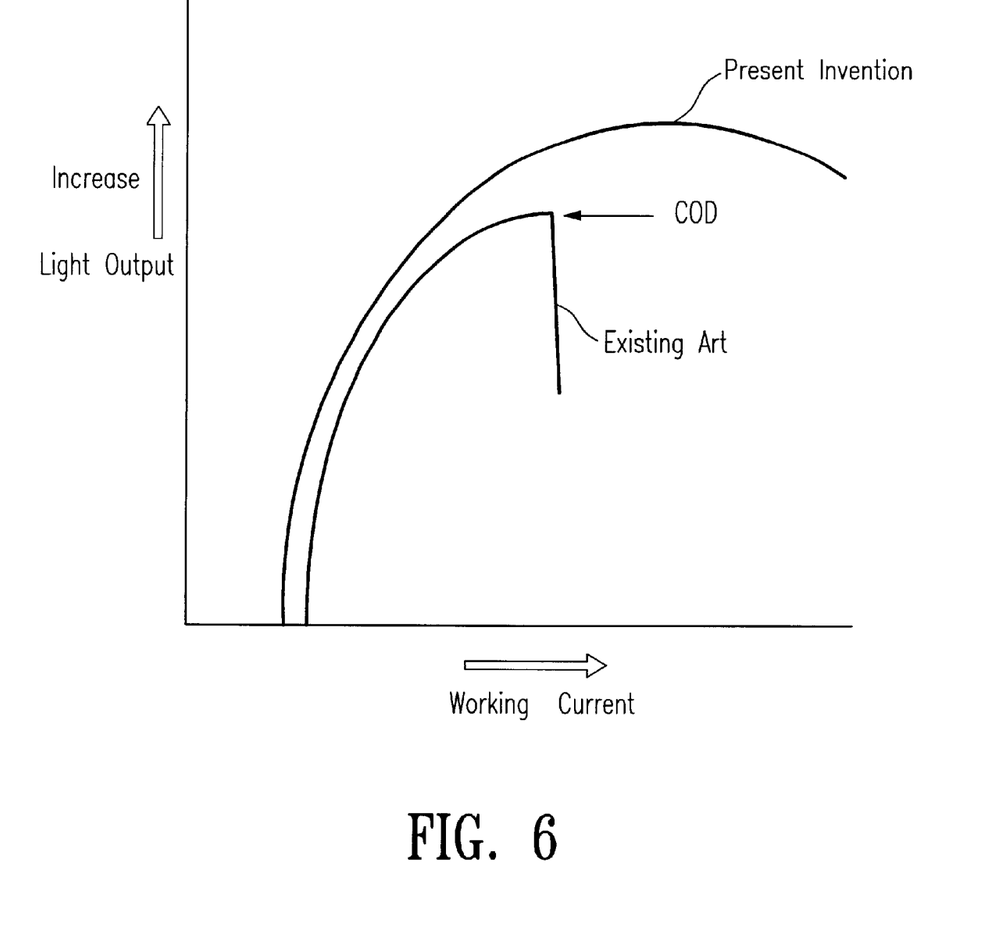
FIG. 6 shows an optical power-current curve for a COD level measurement concerning the semiconductor laser of the present invention and the conventional semiconductor laser.

FIG. 6 is a drawing showing an output power/operation current characteristics in a conventional semiconductor laser and a laser by this invention. In FIG. 6, the abscissa shows an output power and the ordinate shows an operation current.

The output power/operation current Iop (P-I) characteristics of the semiconductor laser of the present invention exhibits a threshold current and an operation current which are significantly reduced compared to the characteristics of the conventional semiconductor laser, thus showing that its performance is enhanced. In conventional laser, there is a steep kink at an operation current and the output power rapidly drops down over the current exceeding the above mentioned currents as shown in the graph. The laser device after showing such P-I characteristics will be incapable of performing a laser oscillation or drastically increase the threshold current or the operation current as mention previously. A magnitude of the maximum optical power level called a COD level immediately before the optical power rapidly reduces, which is shown by the conventional optical power-operation current characteristic curve, is one parameter indicating a reliability of the device. On the contrary, with reference to the optical power-operation current characteristics of the laser device of the present invention, a smooth curve can be obtained, and a characteristic curve similar to the smooth curve can be obtained even after such characteristic measurement was conducted. This implies that the maximum optical power obtained in this laser device of the present invention is not a COD level but a limit due to a power saturation by a Joule heating effect in the laser device. Specifically, according to the present invention, it was proved that the maximum optical power of the semiconductor laser increases and a reliability of the device enhances. Moreover, testing the length of the life of the semiconductor laser, it is observed that the laser of the present invention is remarkably improved compare to conventional laser from a viewpoint of reliability of the semiconductor laser.

While there has been illustrated and described what are presently considered to be preferred embodiments of the present invention, it will be understood by those skilled n(?) the art that various changes and modifications may be made, and equivalents may be substituted for devices thereof without departing from the true scope of the invention. In addition many modifications may be made to adapt a particular situation or material to the teaching of the present invention without departing from the central scope thereof. Therefore, it is intended that this invention not be limited to the particular embodiment disclosed as the best mode contemplated for carrying out this invention, but that the invention included all embodiments falling within the scope of the appended claims.

What is claimed is:

1. A semiconductor laser comprising:
    a laser device having a first end facet emitting laser beam therefrom, and a second end surface, wherein the first end facet is opposed to the second end facet; and
    a multi-layered high reflectivity coating formed on the second facet, and including,
        a first low refractivity film formed on the second end facet of the semiconductor laser, made by an apparatus for forming a thin film without damaging the film, and having a coefficient of linear expansion is 30% more/less than that of a substrate of the semiconductor laser, a refractivity n1 less than 1.8, and an optical thickness thereof about $\lambda/4$ while $\lambda$ is defined as a wavelength of the semiconductor laser,
        a first high refractivity film formed on the first low refractivity film, made by an apparatus for forming a thin film without damaging the film, and having a refractivity n2 more than 1.9, a negative imaginary part of the refractivity less than 0.05, and an optical thickness thereof about $\lambda/4$, and
        a second low refractivity coating formed on the first high refractivity film, made by an apparatus for forming a thin film without damaging the film, and having a refractivity n3 less than 1.7 and less than n1, wherein the second low refractivity film is made by a material different from a material of the first low refractivity film.

2. The semiconductor laser according to claim 1, wherein the first high refractivity film and the second low refractivity film are formed alternately on the first low refractivity film, and total number of the first and second low refractivity film and the first high refractivity film is less than or equal to 9.

3. The semiconductor laser according to claim 2, wherein the uppermost film of the multi-layered high reflection coating is the second low refractivity film, and an optical thickness of the second low refractivity film is about $\lambda/4$, or about $\lambda/2$, or a value between 0 and $\lambda/2$.

4. The semiconductor laser according to claim 2, wherein the uppermost film of the multi-layered high reflectivity coting is the first high refractivity film, and an optical thickness of the second low refractivity film is about $\lambda/4$, or about $\lambda/2$, or a value between 0 and $\lambda/2$.

5. The semiconductor laser according to claim 2, wherein the first low refractivity film is made by aluminum oxide ($Al_2O_3$), the second low refractivity film is made by silicon oxide ($SiO_2$), and the first high refractivity film is made by silicon nitride ($SiN_x$, or $Si_3N_4$).

6. The semiconductor laser according to claim 5, wherein the first and second low refractivity film, and the first high refractivity film is made successively by a method of Electron Cyclotron Resonance (ECR) sputtering.

7. A semiconductor laser comprising:
    a laser devise, comprising an activation layer made of InGaAlP group, having a first end facet emitting laser beam therefrom, and a second end facet; wherein the first end facet is opposed to the second end facet; and
    a multi-layered high reflectivity coating formed on the second end facet, having a reflectance over 30%, and including,
        a first low refractivity film formed on the second end facet of the semiconductor laser, made by an apparatus for forming a thin film without damaging the film, and having a coefficient of linear expansion is 30% more/less than that of a substrate of the semiconductor laser, and a refractivity n1 less than 1.8, and an optical thickness thereof about $\lambda/4$ while $\lambda$ is defined as the wavelength of the semiconductor laser, a first high refractivity film formed on the first low refractivity film, made by an apparatus for forming a thin film without damaging the film, and having a refractivity n2 more than 1.9, and a negative imaginary part of the refractivity less than 0.05, and a second low refractivity film formed on the first high refractivity film, made by an apparatus for forming a thin film without damaging the film, and having a refractivity n3 less than 1.7 and less than n1, wherein the second low refractivity film is made by a material different from a material of the first low refractivity film, wherein the first high refractivity film and the second low refractivity film are formed alternately on the first refractivity film, and the total number of the first and second low refractivity film and the first high refractivity film is less than or equal to 9.

8. The semiconductor laser according to claim 7, wherein the first low refractivity film has an optical thickness about $\lambda/4$, while $\lambda$ is defined as a wavelength of the semiconductor laser, and the first high refractivity film has an optical thickness about $\lambda/4$.

9. The semiconductor laser according to claim 8, wherein the uppermost film of the multi-layered high reflection film is the second low refractivity film, and an optical thickness of the second low refractivity film is about $\lambda/4$, or about $\lambda/2$, or a value between 0 and $\lambda/2$.

10. The semiconductor laser according to claim 8, wherein the uppermost film of the multi-layered high reflection film is the first high refractivity film, and an optical thickness of the second low refractivity film is about $\lambda/4$, or about $\lambda/2$, or a value between 0 and $\lambda/2$.

11. The semiconductor laser according to claim 8, wherein the first low refractivity film is made by aluminium oxide ($Al_2O_3$), the second low refractivity film is made by silicon oxide ($SiO_2$), and the first high refractivity film is made by silicon nitride ($SiN_x$, or $Si_3N_4$).

12. The semiconductor laser according to claim 11, wherein the first and second low refractivity film, and the first high refractivity film is made successively by a method of Electron Cyclotron Resonance (ECR) sputtering.

13. A semiconductor laser comprising:
a laser device having a first end surface emitting laser beam therefrom, and a second end surface, wherein the first end surface is opposed to the second end surface; and a multi-layered high reflection film formed on the second end surface, and including,
a first low refractivity film formed on the second end surface of the semiconductor laser, made by an apparatus for forming a thin film without damaging the film, and having a coefficient of linear expansion is 30% more/less than that of a substrate of the semiconductor laser, a refractivity n1 less than 1.8, and an optical thickness thereof about $\lambda/4$ while $\lambda$ is defined as a wavelength of the semiconductor laser, a first high refractivity film formed on the first low refractivity film, made by an apparatus for forming a thin film without damaging the film, and having a refractivity n2 more than 1.9, a negative imaginary part of the refractivity less than 0.05, and an optical thickness thereof about $\lambda/4$, and a second low refractivity film formed on the first high refractivity film, made by an apparatus for forming a thin film without damaging the film, and having a refractivity n3 less than 1.7 and less than n1, wherein the second low refractivity film is made by a material different from a material of the first low refractivity film; and a second high refractivity film formed on the second low refractivity film, made by an apparatus for forming a thin film without damaging the film, and having a refractivity n4 more than n2, wherein the first high refractivity film and the second low refractivity film are formed alternately on the first low refractivity film, the uppermost film of the multi-layered high reflectivity coating is the second low refractivity film, a film right below the uppermost film is the second high refractivity film, and wherein an optical thickness of the uppermost film is about $\lambda/4$, or about $\lambda/2$, or a value between 0 and $\lambda/2$, an optical thickness of the film right below the uppermost film is about $\lambda/4$, and total number of the first and second low refractivity film and the first and second high refractivity film is less than or equal to 9.

14. The semiconductor laser according to claim 13, wherein the first low refractivity film is made by aluminium oxide ($Al_2O_3$), the second low refractivity film is made by silicon oxide ($SiO_2$), the first high refractivity film is made by silicon nitride ($SiN_x$, or $Si_3N_4$), and the second high refractivity film is made by amorphous silicon ($\alpha$-Si).

15. A method for manufacturing a semiconductor laser comprising the steps of:
forming a first low refractivity film on an end facet opposed to a beam emission facet of the semiconductor laser, and having a coefficient of linear expansion is 30% more/less than that of a substrate of the semiconductor laser, a refractivity n1 less than 1.8, and an optical thickness thereof about $\lambda/4$ while $\lambda$ is defined as a wavelength of the semiconductor laser, forming a first high refractivity film on the first low refractivity film, and having a refractivity n2 more than 1.9, a negative imaginary part of the refractivity less than 0.05, and an optical thickness thereof about $\lambda/4$, and forming a second low refractivity film on the first high refractivity film, and having a refractivity n3 less than 1.7 and less than n1, wherein the second low refractivity film is made by a material different from a material of the first low refractivity film, wherein the first and second low refractivity film and the first high refractivity film are made by an apparatus for forming a thin film without damaging the film.

16. The method according to claim 15, wherein the first and second low refractivity film and the first high refractivity film are made successively by a method of Electron Cyclotron Resonance (ECR) sputtering.

17. The semiconductor laser according to claim 16, wherein the first low refractivity film is made by aluminium oxide ($Al_2O_3$), the second low refractivity film is made by silicon oxide ($SiO_2$), and the first high refractivity film is made by silicon nitride ($SiN_x$, or $Si_3N_4$).

18. A semiconductor laser comprising:
a laser devise, comprising an activation layer made of InGaAlP group, having a first end facet emitting laser beam therefrom, and a second end facet; wherein the first end facet is opposed to the second end facet; and a multi-layered high reflectivity coating formed on the second end facet, having a reflectance over 30%, and including, a first low refractivity film formed on the second end facet of the semiconductor laser, made by an apparatus for forming a thin film without damaging the film, and having a coefficient of linear expansion is 30% more/less than that of a substrate of the semiconductor laser, and a refractivity n1 less than 1.8 a first high refractivity film formed on the first low refractivity film, made by an apparatus for forming a thin film without damaging the film, and having a refractivity n2 more than 1.9, and a negative imaginary part of the refractivity less than 0.05, and a second low refractivity film formed on the first high refractivity film, made by an apparatus for forming a thin film without damaging the film, and having a refractivity n3 less than 1.7 and less than n1, wherein the second low refractivity film is made by a material different from a material of the first low refractivity film, wherein the first high refractivity film and the second low refractivity film are formed alternately on the first refractivity film, and the total number of the first and second low refractivity film and the first high refractivity film is less than or equal to 9.

* * * * *